United States Patent
Garg et al.

(10) Patent No.: US 7,502,974 B2
(45) Date of Patent: Mar. 10, 2009

(54) METHOD AND APPARATUS FOR DETERMINING WHICH TIMING SETS TO PRE-LOAD INTO THE PIN ELECTRONICS OF A CIRCUIT TEST SYSTEM, AND FOR PRE-LOADING OR STORING SAID TIMING SETS

(75) Inventors: Preeti Garg, Sunnyvale, CA (US); Romi Mayder, San Jose, CA (US); Mike Augustin, Loveland, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 386 days.

(21) Appl. No.: 11/361,084

(22) Filed: Feb. 22, 2006

(65) Prior Publication Data

US 2007/0220387 A1  Sep. 20, 2007

(51) Int. Cl.
*G06K 5/04* (2006.01)
(52) U.S. Cl. .................... 714/700; 714/724; 714/25; 714/707; 714/744; 324/765; 702/117
(58) Field of Classification Search .................. None
See application file for complete search history.

(56) References Cited

U.S. PATENT DOCUMENTS

| | | | | |
|---|---|---|---|---|
| 4,637,020 A | * | 1/1987 | Schinabeck | 714/736 |
| 4,806,852 A | * | 2/1989 | Swan et al. | 324/73.1 |
| 4,929,888 A | * | 5/1990 | Yoshida | 714/736 |
| 5,432,797 A | * | 7/1995 | Takano | 714/718 |
| 6,073,259 A | * | 6/2000 | Sartschev et al. | 714/724 |
| 6,192,496 B1 | | 2/2001 | Lawrence et al. | |
| 6,570,397 B2 | | 5/2003 | Mayder et al. | |
| 6,609,077 B1 | * | 8/2003 | Brown et al. | 702/117 |
| 6,651,205 B2 | | 11/2003 | Takahashi | |
| 6,851,076 B1 | | 2/2005 | Cook, III et al. | |
| 7,088,122 B2 | * | 8/2006 | Hartmann et al. | 324/765 |
| 7,243,278 B2 | * | 7/2007 | Arkin | 714/724 |
| 2002/0108079 A1 | | 8/2002 | Takahashi | |
| 2003/0005359 A1 | * | 1/2003 | Magliocco | 714/25 |
| 2003/0005375 A1 | * | 1/2003 | Krech et al. | 714/724 |
| 2003/0030453 A1 | | 2/2003 | Mayder et al. | |
| 2003/0110427 A1 | * | 6/2003 | Rajsuman et al. | 714/724 |
| 2003/0217341 A1 | | 11/2003 | Rajsuman et al. | |
| 2004/0223566 A1 | | 11/2004 | Yamashita | |
| 2005/0022081 A1 | | 1/2005 | Syed | |
| 2005/0022088 A1 | | 1/2005 | Nakayama | |
| 2006/0006896 A1 | | 1/2006 | Mayder et al. | |
| 2006/0156149 A1 | * | 7/2006 | Logisch et al. | 714/744 |
| 2007/0205790 A1 | * | 9/2007 | Ezoe | 324/765 |

* cited by examiner

*Primary Examiner*—John P Trimmings
(74) *Attorney, Agent, or Firm*—Holland & Hart, LLP

(57) ABSTRACT

In one embodiment, a method includes, providing a test program designed to control a circuit test system. The circuit test system has a plurality of test channels, each test channel of which is configured to be selectively coupled to a plurality of sub-channels under control of the test program. The method further includes 1) analyzing the test program to determine what combinations of channels, sub-channels and timing sets are required by the test program, and 2) in response to this analysis, creating a map of which timing sets, for which combinations of channels and sub-channels, should be pre-loaded into pin electronics that correspond to the test channels.

14 Claims, 6 Drawing Sheets

METHOD AND APPARATUS FOR DETERMINING WHICH TIMING SETS TO PRE-LOAD INTO THE PIN ELECTRONICS OF A CIRCUIT TEST SYSTEM, AND FOR PRE-LOADING OR STORING SAID TIMING SETS

BACKGROUND

Many circuit test systems comprise a plurality of test channels, wherein each of the channels is provided with a set of pin electronics that enables the channel to apply stimuli to, or receive responses from, a device under test (DUT). When applying stimuli to a DUT, a set of pin electronics may generate signals in accord with a sequence of test patterns that is specified by a test program. Similarly, and when receiving responses from the DUT, the set of pin electronics may compare DUT responses to a sequence of test patterns specified by the test program.

Given the real-world variances that a test channel may be exposed to as a result of manufacturing variances, environmental conditions and customer loading of the test channel (e.g., via a customer interface or load board that may be coupled to the test channel), a test channel needs to be calibrated. Many types of calibration data may be obtained for a test channel, and the methods and apparatus for obtaining such calibration data are beyond the scope of this disclosure.

Once obtained, calibration data for a test channel may be used, for example, to determine cycle and edge delays that need to be applied to signals that are generated (or received) via the pin electronics of the test channel. Often, a test channel's calibration data is used to construct one or more "timing sets" that are loaded into the pin electronics for the test channel. These timing sets are then used "on-the-fly" to calibrate the signals that are generated (or received) via the pin electronics. Under control of a test program, the pin electronics may be instructed to access different ones of its timing sets when generating or receiving signals having, for example, different cycle times or different signaling levels.

SUMMARY OF THE INVENTION

In one embodiment, a method comprises providing a test program designed to control a circuit test system. The circuit test system has a plurality of test channels, each test channel of which is configured to be selectively coupled to a plurality of sub-channels under control of the test program. The method further comprises 1) analyzing the test program to determine what combinations of channels, sub-channels and timing sets are required by the test program, and 2) in response to this analysis, creating a map of which timing sets, for which combinations of channels and sub-channels, should be pre-loaded into pin electronics that correspond to the test channels.

In another embodiment, a method comprises pre-loading a plurality of sub-channel-specific timing sets into a set of pin electronics that is associated with a test channel of a circuit test system. Each of the sub-channel-specific timing sets provides information for calibrating signals that are transmitted over one of a plurality of sub-channels to which the test channel is selectively coupled. The plurality of sub-channel-specific timing sets that are pre-loaded into the set of pin electronics is less than all of the sub-channel-specific timing sets that are supported by a set of calibration data stored for the test channel and sub-channels. During execution of a test program, and subsequent to said pre-loading, 1) the test channel is coupled to different ones of the sub-channels, as instructed by the test program, and 2) signals are generated or received via the set of pin electronics in accord with ones of the sub-channel-specific timing sets referenced by the test program.

In yet another embodiment, a number of machine-readable media have stored thereon sequences of instructions that, when executed by a machine, cause the machine to perform the actions of the method described in the preceding paragraph.

In still another embodiment, a circuit test system comprises 1) a plurality of test channels; 2) a number of sets of pin electronics that are associated with the plurality of test channels; and 3) a switching matrix to selectively couple each of the test channels to ones of a plurality of sub-channels. A number of timing sets are loaded into one or more of the sets of pin electronics, with each of the timing sets providing information for calibrating signals transmitted over one of the plurality of sub-channels. At least two of the plurality of timing sets are loaded into a first of the sets of pin electronics to provide information for calibrating signals transmitted over different ones of the plurality of sub-channels.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
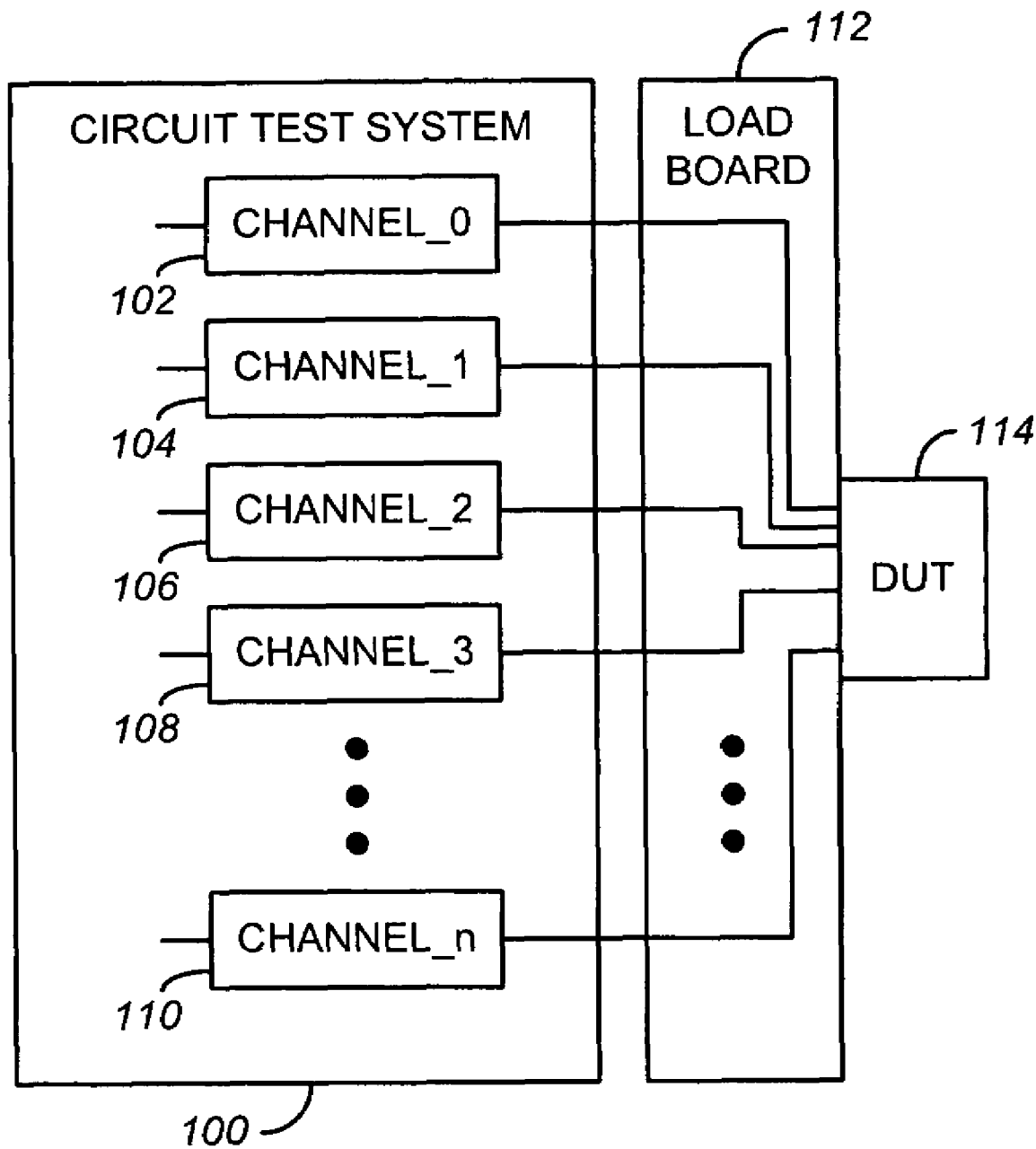
FIG. 1 illustrates an exemplary circuit test system.

FIG. 1 illustrates an exemplary circuit test system 100. The circuit test system 100 comprises a plurality of test channels 102, 104, 106, 108, 110, each of which is associated with its own set of pin electronics (see, for example, FIG. 2, which shows a set of pin electronics 200 for test channel 102). A set of pin electronics 200 may take various forms, but in one embodiment comprises a test processor 202, a pattern generator 204, a timing generator 206, a waveform generator 208, a driver 210, a comparator 212 and a receiver 214.

As shown, the channels 102, 104, 106, 108, 110 of the test system 100 may be coupled to a particular DUT 114 via a load board 112 or other interface that serves to adapt the footprint of the channels 102, 104, 106, 108 to the footprint of the DUT 114.

In operation, various elements of the pin electronics 200 (FIG. 2) may be initialized under control of a test program—either by means of the test processor 202, or by means of an external system. Then, and in response to a test program executed by the test processor 202, signals may be applied to a DUT 114 (FIG. 1) via the driver 210, or signals may be received from the DUT 114 via the receiver 214. One of the items that may be initialized is a plurality of "timing sets" that are stored or accessed by the timing generator 206.

When signals are to be applied to the DUT 114, a test program executed by the test processor 202 causes the test processor 202 to control the pattern generator 204 so that the pattern generator 204 generates 1) a series of test patterns 216 comprised of 1's and 0's that are to be applied to the DUT 114, and 2) a request for timing information. The request for timing information is supplied to the timing generator 206, and is used to index one of the timing sets that is stored or accessed by the timing generator 206. Each of the timing sets specifies how the 1's and 0's of a test pattern are to be applied to the DUT 114. Of note, each timing set is calibrated to the particular test channel for which it is used, but is calibrated in the context of, for example, different ones or combinations of signaling levels, cycle times, et cetera.

The waveform generator 208 receives both 1) the test patterns 216 generated by the pattern generator 204, and 2) their corresponding timing sets 218, as provided by the timing generator 206, and then generates a series of waveforms. These waveforms are then amplified and applied to the DUT 114 via the driver 210.

When signals are to be received from the DUT 114, the test processor 202, pattern generator 204 and timing generator 206 function similarly to how they do when signals are to be applied to the DUT 114. However, the outputs of the timing generator 206 are instead used to 1) control the receipt of data at the receiver 212, and 2) calibrate a waveform to which the comparator 214 can compare received data to verify the structure or function of the DUT 114.

Of note, the test program that is executed by the test processor 202 is typically generated for a particular DUT 114. Therefore, as the test system 100 is used to test different DUTs, a user will cause different test programs to be loaded into the test processor 202 (or memory associated therewith). A user may also cause different test programs to be loaded into the test processor 202 as different aspects of a single DUT 114 are tested.

Figure 3:
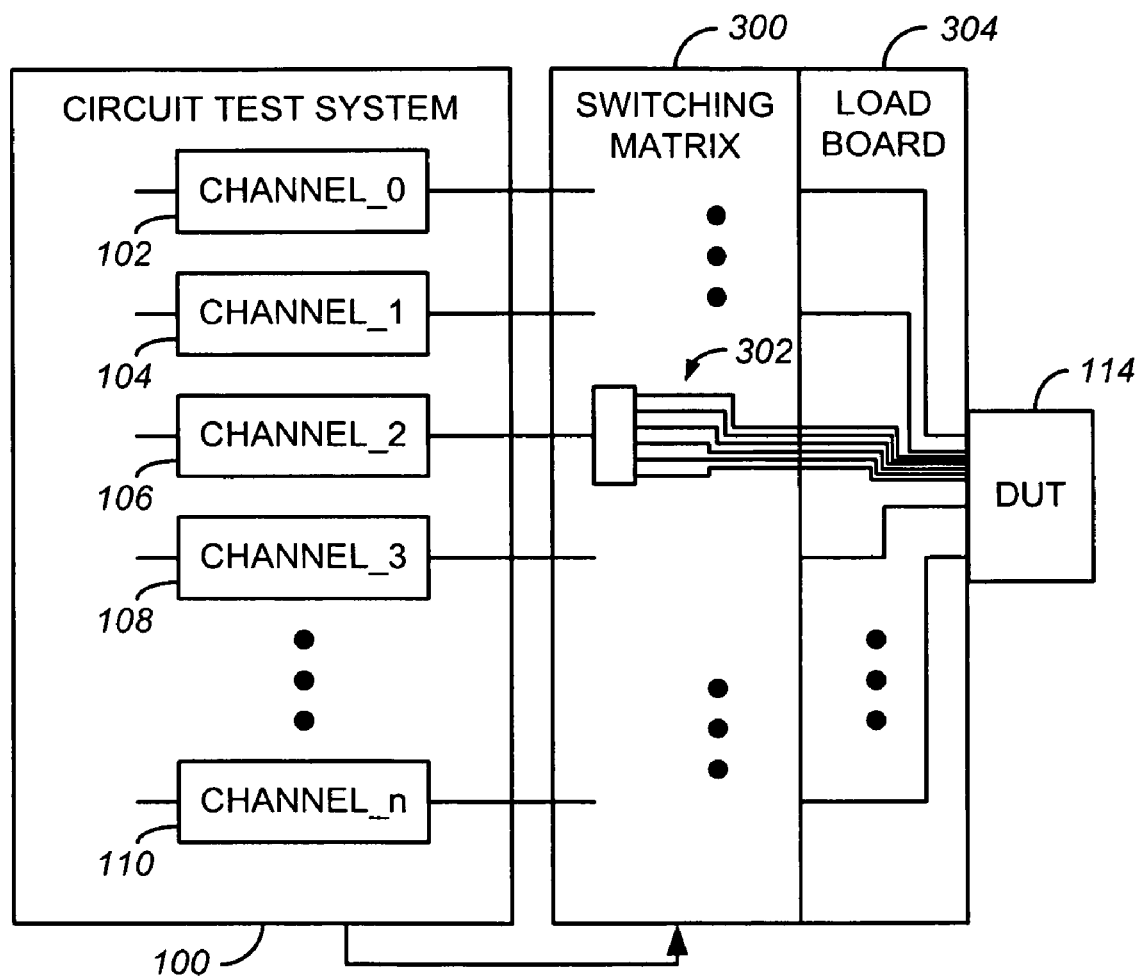
FIG. 3 illustrates the FIG. 1 test system when used in conjunction with a switching matrix.

FIG. 3 illustrates the use of the circuit test system 100 in conjunction with a switching matrix 300. The switching matrix 300 serves to selectively couple each of the test system's channels 102, 104, 106, 108, 110 to ones of a plurality of sub-channels 302. By way of example, the switching matrix 300 is shown to couple each of a system's test channels (e.g., channel 102) to its own group of six sub-channels (e.g., group 302). In this manner, the test channels 102, 104, 106, 108, 110 may be selectively coupled to different pins or pads of a DUT 114 that is coupled to the switching matrix 300. Or, the test channels 102, 104, 106, 108, 110 may be selectively coupled to pins or pads of different DUTs (i.e., for parallel DUT test). In the presence of the switching matrix 300, a different load board 304 may be needed to mate the circuit test system 100 and switching matrix 300 to a DUT 114.

In some cases, the switching matrix 300 may be embodied in an interface that is removable from the circuit test system 100 (as shown). In other cases, the switching matrix 300 may be integrated into the circuit test system 100. The switching functions of the switching matrix 300 may be performed by mechanical relays, solid-state switches, or other switching means that are closed or opened under control of a test program run by the test system 100.

As mentioned in the Background section of this disclosure, calibration data for each of a test system's channels 102, 104, 106, 108, 110 may be used to construct a plurality of timing sets for the channels 102, 104, 106, 108, 110. Some or all of these timing sets may then be loaded into the pin electronics for the channels (e.g., pin electronics 200). By way of example, the timing sets corresponding to a particular test channel may be loaded into locations of a register set that is internal or external to the test channel's timing generator. Timing sets could alternately be loaded into locations (e.g., addresses) of a memory that is internal or external to the timing generator. Each location in which a timing set is located may be associated with a unique identifier (e.g., an address) via which a loaded timing set may be indexed.

In a typical circuit test system 100, many test channels (for example, 128 test channels) terminate at the boundaries of a relatively small footprint for holding a DUT. The space for implementing a set of pin electronics 200 is therefore small. On the other hand, the precision and processing demands of a set of pin electronics 200 are great. A set of pin electronics 200 is therefore costly, and choices must be made regarding what features are most important to implement within a relatively small space (and a particular cost budget). As a result, the size of the register set or memory space allotted for storing local timing sets for a particular test channel is generally very small. For example, the V5×00 test systems offered by Agilent Technologies, Inc. provide register sets for storing only sixteen (16) timing sets per set of pin electronics 200 or test channel 102. Of the sixteen registers, a user's test program may customize or initialize fourteen (14) of them, thereby providing a set of pin electronics 200 with timing sets for fourteen different combinations of cycle times, signaling levels, et cetera.

When the test channels 102, 104, 106, 108, 110 of a circuit test system 100 are coupled to a switching matrix 300, many more signal channels need to be calibrated. That is, instead of (or in addition to) calibrating each of a system's primary test channels 102, 104, 106, 108, 110, each combination of primary test channel 102, 104, 106, 108, 110 and switching matrix sub-channel 302 must be calibrated. For the system 100 shown in FIG. 3, this means a 6-fold increase in the amount of calibration data that is generated. However, cost and space limitations on a test system's pin electronics, as well as the cost of redesigning a system's pin electronics, may not allow a 6-fold increase in the size of the register sets provided for storing local timing sets with a system's pin electronics. Choices must therefore be made regarding which timing sets to load into a system's pin electronics.

One solution to the above problem is to load a set of pin electronics with the timing sets corresponding to a currently used sub-channel (i.e., a sub-channel that has been indexed by a test program). If a test program maps each of a test system's channels 102, 104, 106, 108, 110 to only one sub-channel 302, this solution works well. However, a user typically employs a switching matrix 300 when it is desired to dynamically map test channels 102, 104, 106, 108, 110 to varying sub-channels 302 during the execution of a test program. In these situations, loading all of a single sub-channels' timing sets into a set of pin electronics results in frequent loading and reloading of timing sets into the pin electronics. In fact, experiments using this solution have shown that, during production run of a test program, a significant portion of test time overhead is attributable to the loading and reloading of the different sub-channels' timing sets.

Figure 4:
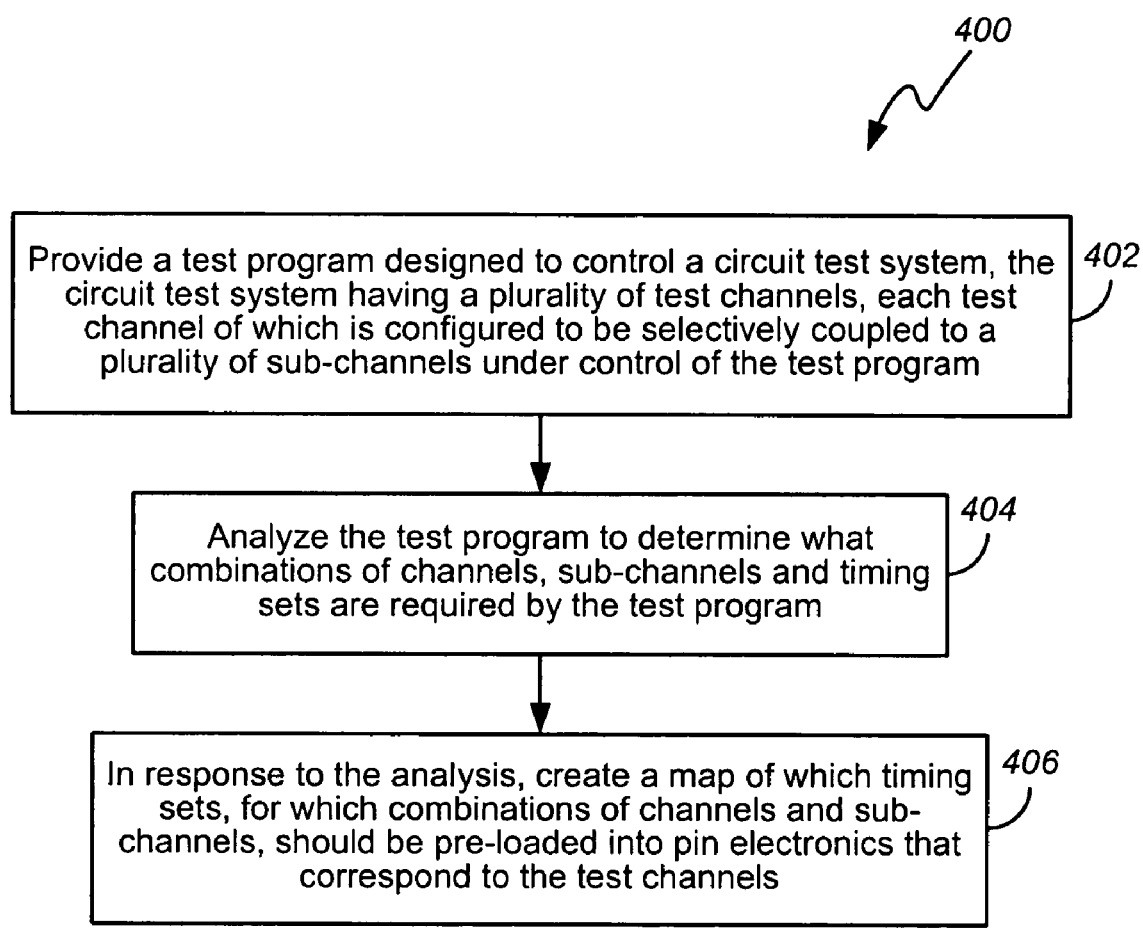
FIG. 4 illustrates a method for creating a map of which timing sets should be pre-loaded into the pin electronics corresponding to a test system's test channels.

An alternate solution is to pre-load a set of pin electronics 200 with those timing sets that correspond to particular combinations of test channels, sub-channels and timing sets that are actually employed by a test program. To this end, FIG. 4 illustrates a method 400 in which a system or user provides a test program designed to control a circuit test system 100 of the type shown in FIG. 3 (i.e., where a plurality of test channels are configured to be selectively coupled to a plurality of sub-channels; see block 402). The test program may then be analyzed (e.g., by a user or software) to determine what combinations of channels, sub-channels and timing sets are required by the test program (see block 404). Thereafter, and in response to the analysis of the test program, a map may be created to indicate which timing sets, for which combinations of channels and sub-channels, should be pre-loaded into pin electronics that correspond to the test channels (see block 406).

Figure 5:
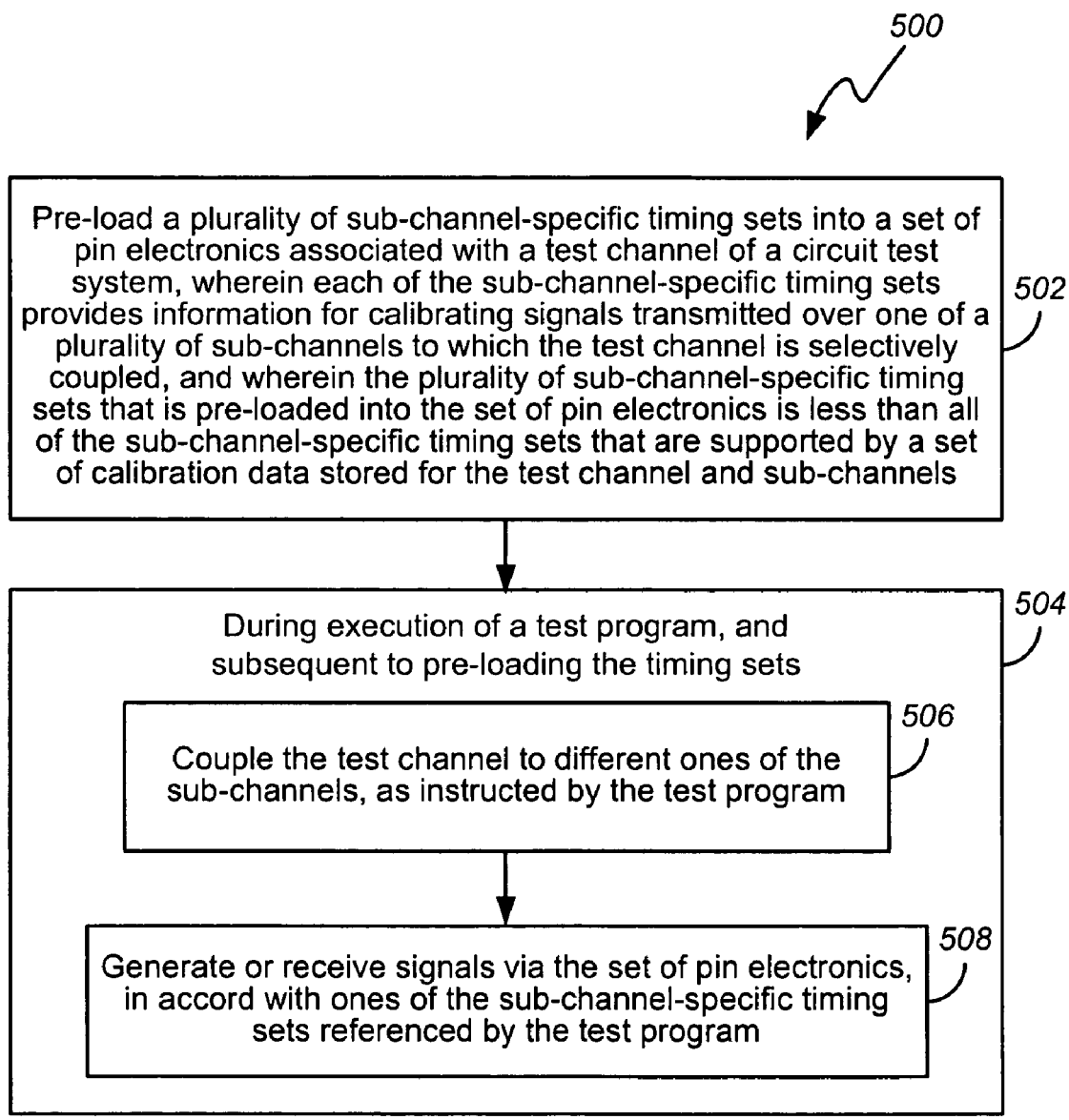
FIG. 5 illustrates a method for pre-loading timing sets into the pin electronics corresponding to a test system's test channels.

Once generated, a map of which timing sets should be pre-loaded into which ones or a plurality of pin electronics 200 may be used as shown in FIG. 5. FIG. 5 illustrates a method 500 in which a plurality of sub-channel-specific timing sets are pre-loaded into a set of pin electronics 200 that is associated with a test channel 102 of a circuit test system 100 (see block 502). Each of the sub-channel-specific timing sets provides information for calibrating signals transmitted over one of a plurality of sub-channels 302 to which the test channel 102 is selectively coupled. After pre-loading the timing sets, and during execution of a test program (block 504), 1) the test channel 102 is coupled to different ones of the sub-channels 302, as instructed by the test program (see block 506), and 2) signals are generated or received via the pin electronics 200, in accord with ones of the sub-channel-specific timing sets referenced by the test program (see block 508). Typically, the steps 502, 504, 506 of the method 500 will be performed for each of a system's test channels 102, 104, 106, 108, 110, with equivalent steps being performed in parallel with respect to each of the test channels 102, 104, 106, 108, 110.

As a result of space limitations on the register set or memory where local timing sets are stored, the plurality of sub-channel-specific timing sets that are pre-loaded into a set of pin electronics 200 will typically be less than all of the sub-channel-specific timing sets that are supported by a set of calibration data stored for a system's test channels 102, 104, 106, 108, 110 and sub-channels 302.

As indicated above, part or all of the method 400 may be performed by a user. Otherwise, part or all of the methods 400 and 500 may be implemented by means of sequences of instructions stored on machine-readable media. When executed by a machine, the sequences of instructions then cause the machine to perform the actions of the methods 400, 500. The machine-readable media may include, for example, any number or mixture of fixed or removable media (such as one or more fixed disks, random access memories (RAMs), read-only memories (ROMs), or compact discs), at either a single location or distributed over a network. The media may be located internally or externally to the test system 100. The sequences of instructions will typically comprise software, but could also comprise firmware.

Figure 6:
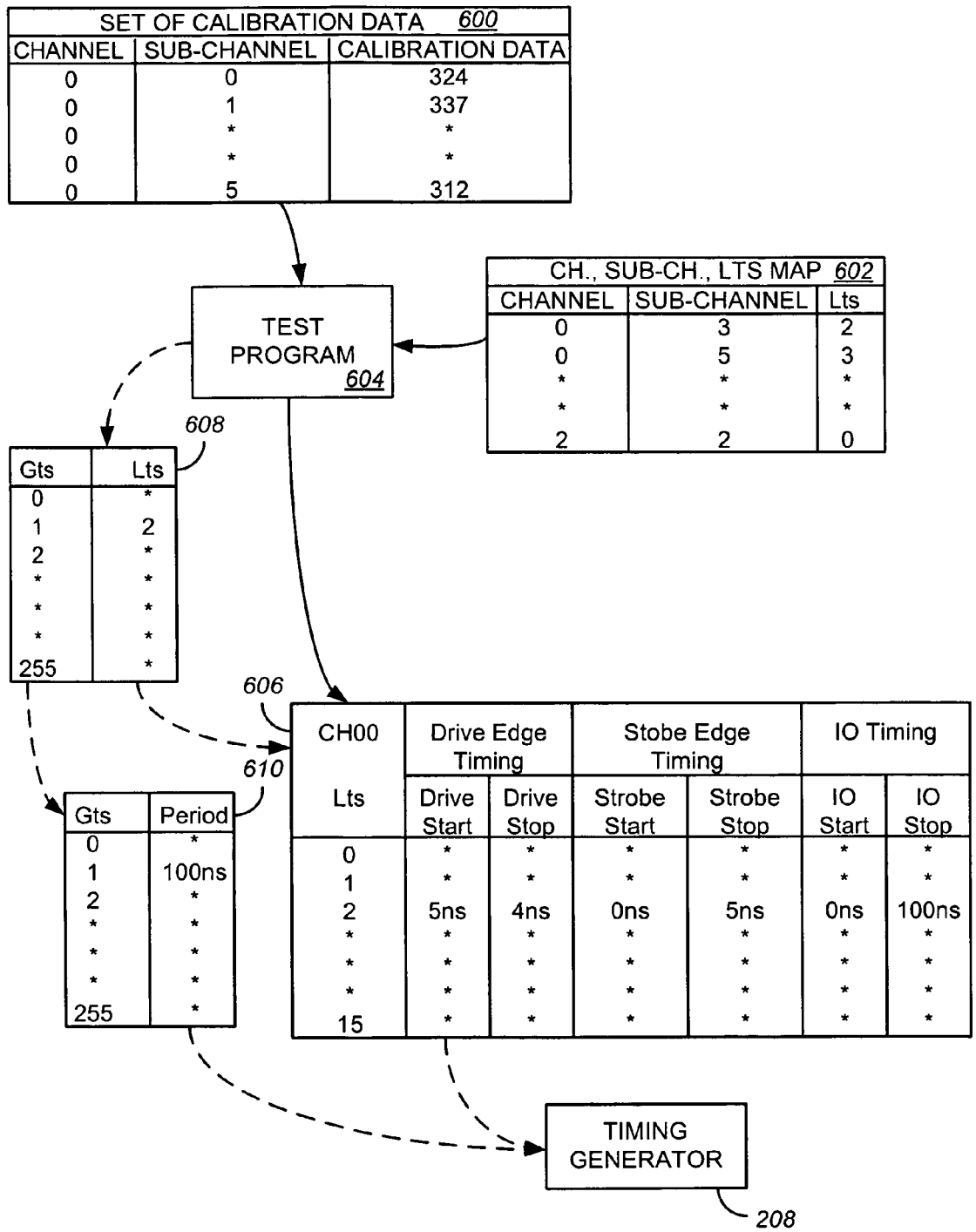
FIG. 6 illustrates exemplary data structures for implementing the method shown in FIG. 5.

FIG. 6 illustrates exemplary data structures that may be created or accessed during execution of the method 500 (or variants thereof). A first of the structures is a map 602 that indicates which combinations of test channels and sub-channels are mapped to particular local timing sets. This map 602 may be manually or semi-automatically created by a user as the user (or software) parses a test program to identify combinations of test channels, sub-channels and local timing sets that are employed by the test program. It is noted that a "test program" as defined herein, is any one or more programs that together serve to test part or all of a DUT.

A second of the data structures may include one or more tables of calibration data 600 (i.e., a set of calibration data). These tables may contain various types of calibration data, as is known in the art, and their contents will not be discussed in detail herein. In one embodiment, some or all of the calibration tables 600 contain entries for each of a system's test channels 102, 104, 106, 108, 110, and for each of the sub-channels 302 that corresponds to the test channels. Also, some of the calibration tables 600 may comprise data that is obtained in the absence of the switching matrix 300; and some of the calibration tables 600 may comprise data that is obtained in the presence of the switching matrix 300.

Figure 2:
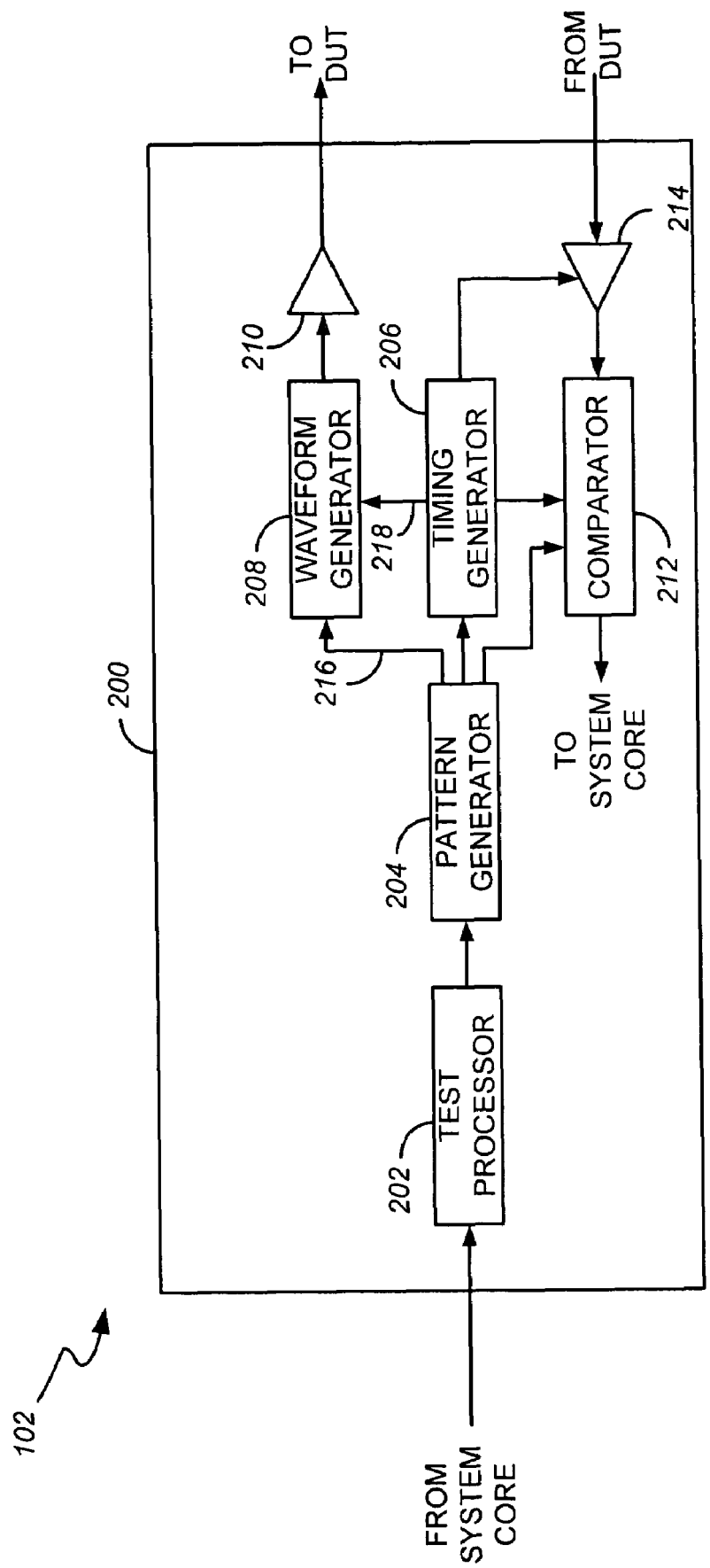
FIG. 2 illustrates an exemplary set of pin electronics for one test channel of the FIG. 1 test system.

During initialization of a circuit test system 100, the map 602 may be accessed by a computer program to determine which timing sets need to be stored in which pin electronics 200 (FIG. 2). By way of example, the computer program may be a test program 604 or a system initialization program. In response to the entries contained within the map 602, the computer program may access the set of calibration data 600 and generate the timing sets that are required by the map 602. Alternately, pre-generated timing sets may simply be retrieved. The generated or retrieved timing sets may then be pre-loaded into the appropriate locations in register set(s) of a number of pin electronics 200. Table 606 illustrates the exemplary storage of timing sets in one of these register sets. Note that each of the timing sets (lts) shown in table 606 comprises values for calibrating drive edge timing (stop and start), strobe edge timing (start and stop) and IO timing (start and stop). Other and/or different calibration data may also be included in a timing set (lts).

During execution of a test program 604 that uses the pre-loaded timing sets 606, the test program 604 may index a particular one of the timing sets 606. This is also shown in FIG. 6. In FIG. 6, and by way of example, the test program 604 indexes a timeset map 608 containing entries of corresponding local timing sets (lts) and global timing sets (gts) identifiers. In this example, local timing sets are used to provide edge timing information that is specific to particular combinations of a system's channels and sub-channels, while global timing sets are used to provide cycle timing shared by multiple different combinations of channels and sub-channels. In one embodiment, the timeset map 608 is indexed using an identifier of a local timing set (lts), to thereby determine an identifier of a corresponding global timing set (gts). Lts and gts identifiers are then used to index corresponding lts and gts tables 606, 610, and the indexed lts and gts values (i.e., calibration values) are then output to the timing generator 208.

Using the methods and apparatus disclosed above, timing sets for different combinations of a system's channels 102, 104, 106, 108, 110 and sub-channels 302 may be simultaneously stored in a test channel's pin electronics 200, thereby mitigating the likelihood of any need to swap the timing sets that are stored in a system's pin electronics during execution of a test program. This can save considerable time when executing a test program in the context of a test system 100 that is interfaced with a switching matrix 300. Of note, and depending on the particular test program at issue, a set of pin electronics may be pre-loaded with different numbers of timing sets for each of two sub-channels. Also, different sets of pin electronics may be pre-loaded with different numbers of timing sets.

What is claimed is:

1. A number of machine-readable media having stored thereon sequences of instructions that, when executed by a machine, cause the machine to perform the actions of:

pre-loading a plurality of sub-channel-specific timing sets into a set of pin electronics that is associated with a test channel of a circuit test system, the set of pin electronics comprising a plurality of locations for storing the sub-channel-specific timing sets, each location of which is associated with a unique identifier, wherein i) each of the sub-channel-specific timing sets provides information for calibrating signals transmitted over one of a plurality of sub-channels to which the test channel is selectively coupled, ii) the sub-channel-specific timing sets are loaded into said locations in accord with a map that maps ones of the unique identifiers to ones of the sub-channels based on combinations of channels, sub-channels and timing sets required by a test program, despite the test program requiring differing numbers of the sub-channel-specific timing sets for different ones of the sub-channels, and iii) the plurality of sub-channel-specific timing sets pre-loaded into the set of pin electronics is less than all of the sub-channel-specific timing sets that are supported by a set of calibration data stored for the test channel and sub-channels; and during execution of a test program, and subsequent to said pre-loading, coupling the test channel to different ones of the sub-channels, as instructed by the test program; and generating or receiving signals via the set of pin electronics, in accord with ones of the sub-channel-specific timing sets referenced by the test program.

2. The media of claim 1, further comprising sequences of instructions that, when executed by the machine, cause the machine to i) access the set of calibration data stored for the test channel and sub-channels, and ii) generate the sub-channel-specific timing sets in response thereto.

3. The media of claim 1, wherein the sequences of instructions cause the machine to pre-load the plurality of sub-channel-specific timing sets into a register set of a timing generator of the set of pin electronics.

4. The media of claim 1, wherein the sequences of instructions cause the machine to pre-load the plurality of sub-channel-specific timing sets into a memory of the set of pin electronics.

5. The media of claim 1, wherein the sequences of instructions cause the machine to respectively perform said pre-loading, coupling, and generating or receiving actions for each of a plurality of test channels; wherein each test channel is associated with a respective one of a plurality of sets of pin electronics; and wherein each of the test channels is associated with a plurality of sub-channels to which the test channel is selectively coupled.

6. A method, comprising:

pre-loading a plurality of sub-channel-specific timing sets into a set of pin electronics that is associated with a test channel of a circuit test system, the set of pin electronics comprising a plurality of locations for storing the sub-channel-specific timing sets, each location of which is associated with a unique identifier, wherein i) each of the sub-channel-specific timing sets provides information for calibrating signals transmitted over one of a plurality of sub-channels to which the test channel is selectively coupled, ii) the sub-channel-specific timing sets are loaded into said locations in accord with a map that maps ones of the unique identifiers to ones of the sub-channels based on combinations of channels, sub-channels and timing sets required by a test program, despite the test program requiring differing numbers of the sub-channel-specific timing sets for different ones of the sub-channels, and iii) the plurality of sub-channel-specific timing sets pre-loaded into the set of pin electronics is less than all of the sub-channel-specific timing sets that are supported by a set of calibration data stored for the test channel and sub-channels; and during execution of a test program, and subsequent to said pre-loading, coupling the test channel to different ones of the sub-channels, as instructed by the test program; and generating or receiving signals via the pin electronics, in accord with ones of the sub-channel-specific timing sets referenced by the test program.

7. The method of claim 6, wherein said pre-loading, coupling, and generating or receiving actions are respectively performed for each of a plurality of test channels; wherein each test channel is associated with a respective one of a plurality of sets of pin electronics; and wherein each of the test channels is associated with a plurality of sub-channels to which the test channel is selectively coupled.

8. The method of claim 6, wherein at least two of the sub-channel-specific timing sets that are pre-loaded into the set of pin electronics correspond to different ones of the plurality of sub-channels.

9. A circuit test system, comprising:

a plurality of test channels;

a number of sets of pin electronics that are associated with the plurality of test channels, each of the set of pin electronics comprising a plurality of locations for storing timing sets, each location of which is associated with a unique identifier; and a switching matrix to selectively couple each of the test channels to ones of a plurality of sub-channels;

wherein a number of timing sets are loaded into one or more of the sets of pin electronics;

wherein each of the timing sets provides information for calibrating signals transmitted over one of the plurality of sub-channels;

wherein at least two of the plurality of timing sets are loaded into a first of the sets of pin electronics to provide information for calibrating signals transmitted over different ones of the plurality of sub-channels; and wherein the timing sets loaded into the first of the sets of pin electronics comprise different numbers of timing sets for each of two of the sub-channels.

10. The circuit test system of claim 9, further comprising:

a set of calibration data for the test channels and sub-channels; and a computer program to cause the circuit test system to i) access the set of calibration data for the test channels and sub-channels and generate the timing sets in response thereto, and ii) load the timing sets into the one or more of the sets of pin electronics.

11. The circuit test system of claim 10, wherein the set of calibration data exceeds a combined timing set storage capacity of the number of sets of pin electronics.

12. The circuit test system of claim 9, wherein each of the sets of pin electronics comprises a respective timing generator, and wherein the timing sets are loaded into register sets of ones of the timing generators.

13. The circuit test system of claim 9, wherein each of the sets of pin electronics comprises a respective memory, and wherein the timing sets are loaded into ones of the memories.

14. A method, comprising:

providing a test program designed to control a circuit test system, the circuit test system having a plurality of test channels, each test channel of which is configured to be selectively coupled to a plurality of sub-channels under control of the test program;

analyzing the test program to determine what combinations of channels, sub-channels and timing sets are required by the test program; and in response to said analysis, creating a map of which timing sets, for which combinations of channels and sub-channels, should be pre-loaded into pin electronics that correspond to the test channels, said map being created based on a number of locations for storing timing sets per channel, and not on a number of locations for storing timing sets per sub-channel.

\* \* \* \* \*